US010447065B2

(12) United States Patent
Hwang et al.

(10) Patent No.: US 10,447,065 B2
(45) Date of Patent: Oct. 15, 2019

(54) WIRELESS POWER TRANSMISSION MODULE

(71) Applicant: Amosense Co., Ltd., Cheonan-si (KR)

(72) Inventors: Seung Jae Hwang, Incheon (KR); Kil Jae Jang, Seongnam-si (KR)

(73) Assignee: Amosense Co., Ltd., Cheonan-si (KR)

(*) Notice: Subject to any disclaimer, the term of this patent is extended or adjusted under 35 U.S.C. 154(b) by 26 days.

(21) Appl. No.: 15/743,290

(22) PCT Filed: Jun. 9, 2016

(86) PCT No.: PCT/KR2016/006139
§ 371 (c)(1),
(2) Date: Jan. 10, 2018

(87) PCT Pub. No.: WO2017/014430
PCT Pub. Date: Jan. 26, 2017

(65) Prior Publication Data
US 2018/0198310 A1   Jul. 12, 2018

(30) Foreign Application Priority Data
Jul. 20, 2015   (KR) .................. 10-2015-0102523

(51) Int. Cl.
*H02J 7/00* (2006.01)
*H02J 7/02* (2016.01)
(Continued)

(52) U.S. Cl.
CPC .............. *H02J 7/025* (2013.01); *H01F 27/22* (2013.01); *H01F 27/365* (2013.01); *H01F 38/14* (2013.01);
(Continued)

(58) Field of Classification Search
USPC ......................................... 320/108
See application file for complete search history.

(56) References Cited

U.S. PATENT DOCUMENTS

2009/0021212 A1* 1/2009 Hasegawa ........... H01F 27/2871
320/108
2013/0106198 A1* 5/2013 Kuk ....................... H01F 38/14
307/104

(Continued)

FOREIGN PATENT DOCUMENTS

JP   1996-238326    9/1996
JP   2011-120432 A  6/2011
(Continued)

OTHER PUBLICATIONS

International Search Report of the ISA/KR dated Oct. 11, 2016; for PCT/KR2016/006139; 4 pages.

*Primary Examiner* — Samuel Berhanu
(74) *Attorney, Agent, or Firm* — Daly, Crowley, Mofford & Durkee, LLP

(57) ABSTRACT

A wireless power transmission module is provided. According to an exemplary embodiment of the present disclosure, a wireless power transmission module includes an antenna unit, a magnetic field shielding sheet, and a planar heat radiating plate. The antenna unit includes at least one wireless power transfer antenna. The magnetic field shielding sheet shields a magnetic field generated by the antenna unit to suppress external leakage of the magnetic field and concentrate the magnetic field in a desired direction. The planar heat radiating plate which is disposed on one surface of the magnetic field shielding sheet to release heat generated by the antenna unit. The wireless power transmission module is equipped or embedded in a vehicle to be used to charge a main battery of a portable terminal.

16 Claims, 15 Drawing Sheets

(51) Int. Cl.
*H05K 9/00* (2006.01)
*H01F 38/14* (2006.01)
*H05K 3/28* (2006.01)
*H05K 7/20* (2006.01)
*H01F 27/22* (2006.01)
*H01F 27/36* (2006.01)
*H02J 50/10* (2016.01)
*H02J 50/80* (2016.01)
*H02J 50/12* (2016.01)
*H01Q 7/00* (2006.01)
*H02J 5/00* (2016.01)
*H01Q 21/29* (2006.01)

(52) U.S. Cl.
CPC ............ *H02J 7/0042* (2013.01); *H02J 50/10* (2016.02); *H05K 3/281* (2013.01); *H05K 7/20472* (2013.01); *H05K 9/00* (2013.01); *H01Q 7/00* (2013.01); *H01Q 21/29* (2013.01); *H02J 5/005* (2013.01); *H02J 50/12* (2016.02); *H02J 50/80* (2016.02)

(56) References Cited

U.S. PATENT DOCUMENTS

| 2014/0210406 | A1  | 7/2014 | Na et al. | |
| 2016/0064814 | A1* | 3/2016 | Jang ................. | H01Q 1/526 |
| | | | | 343/842 |
| 2016/0210616 | A1* | 7/2016 | Lee ................... | G06Q 20/3278 |
| 2016/0248278 | A1* | 8/2016 | Ebe ................... | H01F 38/14 |

FOREIGN PATENT DOCUMENTS

| JP | 2014-087136 A | 5/2014 |
| KR | 10-2012-0073792 | 9/2012 |
| KR | 10-2013-0024757 | 3/2013 |
| KR | 10-2015-0024713 | 3/2015 |
| KR | 10-2015-0050541 | 5/2015 |

* cited by examiner

150'

WIRELESS POWER TRANSMISSION MODULE

CROSS-REFERENCE TO RELATED APPLICATION

This application is a U.S. National Stage of PCT/KR2016/006139 filed in the Korean language on Jun. 9, 2016, entitled: "Wireless Power Transmission Module" which application claims priority to Korean Application No. 10-2015-0102523 filed on Jul. 20, 2015, which applications are each hereby incorporated herein by reference in their entireties.

BACKGROUND

Technical Field

The present disclosure relates to a wireless power transmission system, and more particularly, to a wireless power transmission module which wirelessly supplies power to charge batteries of electronic devices.

Discussion of the Related Art

Recently, usage of electric devices with a battery which is charged by external power, for example, usage of a mobile terminal, such as a portable phone, a smart phone, a tablet personal computer (PC), a notebook computer, a digital broadcasting terminal, a personal digital assistant (PDA), a portable multimedia player (PMP), or a navigation system, is increasing.

Therefore, surrounding environments related with the usage of the mobile terminal is spreading to a dynamic space such as a vehicle.

As a result, usage of a charger which can conveniently charge a battery of a terminal even in a vehicle is increasing.

As an electric connecting method of a charger and a terminal (or a battery) at the time of charging the battery in the vehicle, there is a method that connects a charger connected to a power source of the vehicle to the terminal through a contact terminal or a cable to supply electric energy.

Among these, according to the terminal supply method in which a charger and a portable terminal include contact terminals, when they are exposed to moisture, a charged energy may be dissipated. Further, at the time of being contacted or separated, fire may be caused due to instantaneous discharging phenomenon or the charging may not be satisfactorily performed due to contact failure.

Therefore, a contactless charging system which uses a wireless power transfer method without configuring the contact terminals has been suggested.

The contactless charging system supplies electric energy supplied from a power source of a vehicle in a wireless transferring manner and includes a wireless power transmission module which is embedded in the vehicle and a wireless power reception module which is included in the portable terminal to receive electric energy from the wireless power transmission module.

As an example of the contactless method, a magnetic induction charging method is widely used. According to the magnetic induction charging method, a primary coil (a power transmitting coil) is provided in the wireless power transmission module and a secondary coil (an induction coil or a power receiving coil) is provided in the wireless power reception module so that when the portable terminal approaches the charger, the portable terminal is charged by inductive coupling between the primary coil and the secondary coil.

In this case, the wireless power transmission module uses three planar coils to increase an alignment area with the wireless power reception module and any one of three planar coils partially overlaps the remaining two coils.

An overlapping area and an overlapping position between coils are strictly defined according to a predetermined standard to achieve smooth wireless charging.

Therefore, three coils need to be precisely arranged in accordance with a requested standard. However, in the related art, in order to precisely arrange positions between coils, two planar coils are disposed first and then a remaining coil is disposed in a determined position. The coils are attached to each other using an adhesive in order to suppress displacement of the position between the coils.

Therefore, a working process is very inconvenient. Further, when a failure in the alignment between the coils is found after completing the working process, it is very inconvenient to correct the displacement between the coils because the coils are bonded to each other.

In the meantime, in the wireless power transmission module, a heat radiating unit is disposed on one surface of a shielding sheet to increase a charging efficiency by discharging the heat generated at the time of wireless charging to the outside. The heat radiating unit includes a heat radiating member which is formed of a graphite plate and a protective film which is attached to the heat radiating member to suppress exposure of the heat radiating member. As the protective film, a fluorine resin based film such as PET is generally used.

However, the protective film of the related art is formed of a fluorine resin based material such as PET so that strength of the material is weak. Therefore, the protective film may be torn or easily scratched due to an external impact. Accordingly, the protective film may not satisfactorily perform a function as a protective film for protecting the heat radiating member.

SUMMARY

Object of the Invention

An object to be achieved by the present disclosure is to provide a wireless power transmission module which simply disposes a plurality of planar coils according to a certification standard and improves a heat generation problem caused when the planar coil operates.

Another object to be achieved by the present disclosure is to provide a wireless power transmission module which increases an assembling property and a fastening property with other components.

Moreover, another object to be achieved by the present disclosure is to provide a wireless power transmission module which increases a rigidity of the material by replacing a material of a protective film which is attached on an exposed surface of a heat radiating plate with a metal material to impose not only a protecting function which suppresses damage due to the external shock, but also a heat radiating function to simultaneously perform a plurality of functions by one member and improves a heat radiating performance without increasing an entire thickness of a heat radiating plate.

Technical Solution

According to an aspect of the present disclosure, there is provided a wireless power transmission module. The wireless power transmission module includes an antenna unit, a magnetic field shielding sheet, and a planar heat radiating plate. The antenna unit includes at least one wireless power transfer antenna. The magnetic field shielding sheet shields a magnetic field generated by the antenna unit to suppress external leakage of the magnetic field and concentrate the magnetic field in a desired direction. The planar heat radiating plate is disposed on one surface of the magnetic field shielding sheet.

In an exemplary embodiment, the planar heat radiating plate may include a planar copper plate or an aluminum plate.

In an exemplary embodiment, the magnetic field shielding sheet may be formed with at least one through hole with a predetermined area which penetrates the magnetic field shielding sheet in a region corresponding to a hollow portion of the wireless power transfer antenna to allow air around the antenna unit to move to the heat radiating plate side.

In an exemplary embodiment, the heat radiating plate may include a graphite sheet and a metallic protective film which is attached onto one surface of the graphite sheet to protect and conceal the graphite sheet and serve as an auxiliary heat radiating sheet.

In an exemplary embodiment, the metallic protective film may be an aluminum foil or a copper foil, and at least one slit may be formed on the aluminum foil or the copper foil. The slit may be formed in a region corresponding to the wireless power transfer antenna in a direction to be perpendicular to a length direction of an antenna pattern or to a tangent line of the antenna pattern.

In an exemplary embodiment, the metallic protective film may be attached onto the graphite sheet by means of an adhesive layer having thermal conductivity.

In an exemplary embodiment, the metallic protective film may include a base material layer formed of a metal material and a coating layer which is emissively coated onto at least one surface of the base material layer.

In an exemplary embodiment, the magnetic field shielding sheet may include any one of an amorphous ribbon sheet, a ferrite sheet, and a polymer sheet.

In an exemplary embodiment, the magnetic field shielding sheet may be formed of a plurality of divided atypical minute pieces.

In an exemplary embodiment, the antenna unit may be formed of a plurality of planar coils and may include a supporting plate in which at least one seating groove is formed on a first surface and a second surface which are opposite to each other. The plurality of planar coils may be disposed in the seating groove.

In an exemplary embodiment, any one of the plurality of planar coils may be disposed in a first seating groove formed on the first surface and the remaining planar coils may be disposed in a second seating groove formed on the second surface.

In an exemplary embodiment, the first seating groove and the second seating groove may be formed to have a depth which is the same size as a thickness of the planar coils.

In an exemplary embodiment, the first seating groove and the second seating groove may be formed on the first surface and the second surface, respectively, such that the first and second grooves at least partially overlap each other to form an overlapping region.

In an exemplary embodiment, a part of the overlapping region may be formed so as to penetrate the supporting plate so that a part of the planar coil disposed in the first seating groove is in direct contact with a part of the planar coil disposed in the second seating groove.

In an exemplary embodiment, protrusions may be formed in a position corresponding to a central empty space of the planar coils in a central region of the first seating groove and the second seating groove, respectively.

In an exemplary embodiment, a partial area of a first protrusion formed in the first seating groove may be in direct contact with a part of the planar coil disposed in the second seating groove to support a part of the planar coil disposed in the second seating groove. A partial area of a second protrusion formed in the second seating groove may be in direct contact with a part of the planar coil disposed in the first seating groove to support a part of the planar coil disposed in the first seating groove.

In an exemplary embodiment, the supporting plate may be formed with at least one fastening hole to be coupled with a fastening member, where the at least one fastening hole may penetrate the supporting plate.

In an exemplary embodiment, a metal member having a predetermined area may be partially embedded in the supporting plate and the fastening hole is formed in a position corresponding to the metal member.

In an exemplary embodiment, a coating layer having a heat radiating property may be formed on an outer surface of the supporting plate.

In an exemplary embodiment, the supporting plate may be formed of a plastic material having a heat radiating property.

Advantageous Effects

According to the present disclosure, a plurality of planar coils can be conveniently disposed according to the certification standard using a supporting plate, and thus assembling productivity can be increased. The aligned positions of the coils can be prevented from being changed by fixing the positions of the planar coils through the seating grooves, thereby preventing a charging efficiency from being lowered. Further, an assembling property and a fastening property of the coils with other components can be increased.

Further, according to the present disclosure, the supporting plate becomes to have a heat radiating function so that a heat generation problem generated when the planar coils operates can be improved.

Furthermore, according to the present disclosure, the material of the protective film which is attached onto an exposed surface of the heat radiating plate is replaced with a metal material to increase a rigidity of the material. Therefore, the supporting plate with the protective film can have not only a protecting function which prevents damage due to an external shock but also a heat radiating function, and thus the supporting plate with the protective film is a multifunctional member. Further, the heat radiating performance can be improved without increasing an entire thickness of the heat radiating plate.

DETAILED DESCRIPTION OF THE EMBODIMENTS

Figure 1:
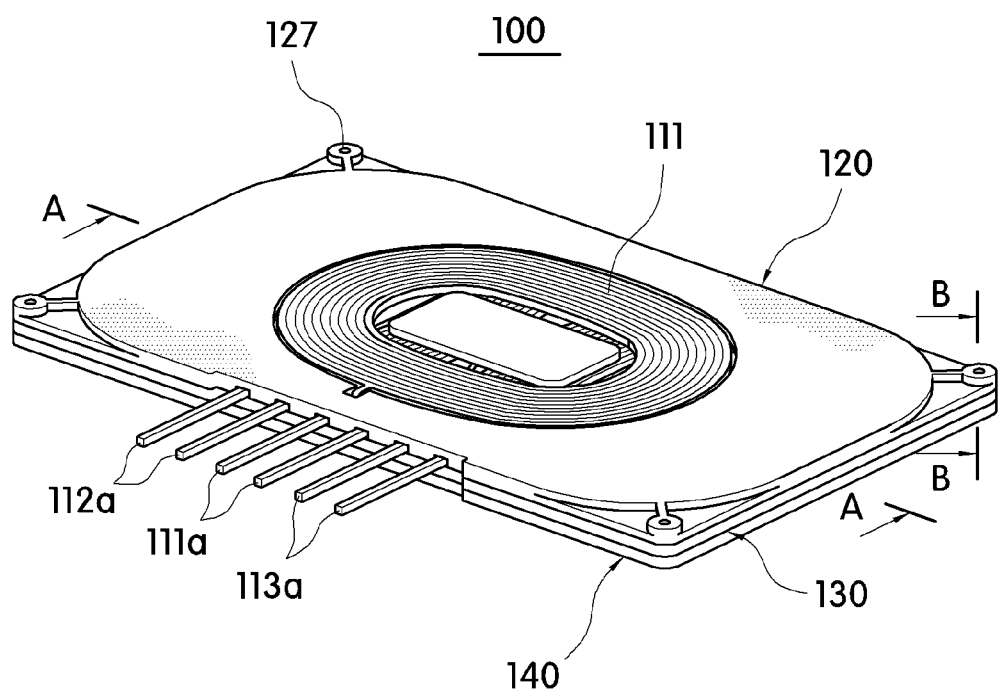
FIG. 1 is a view illustrating a wireless power transmission module according to an exemplary embodiment of the present disclosure.
Figure 2:
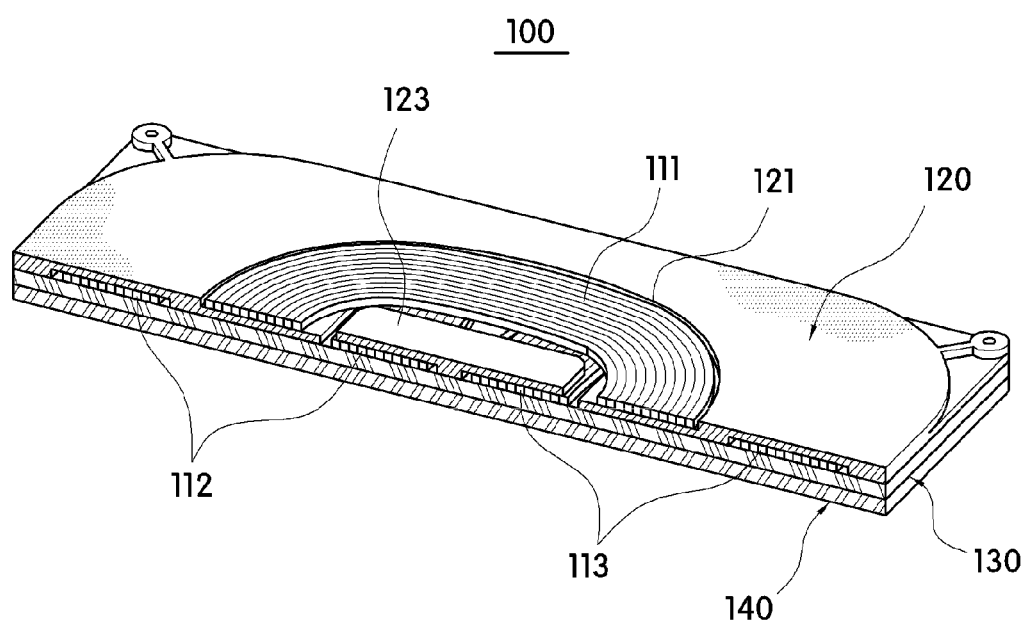
FIG. 2 is a cross-sectional view taken along the line A-A of FIG. 1.
Figure 3:
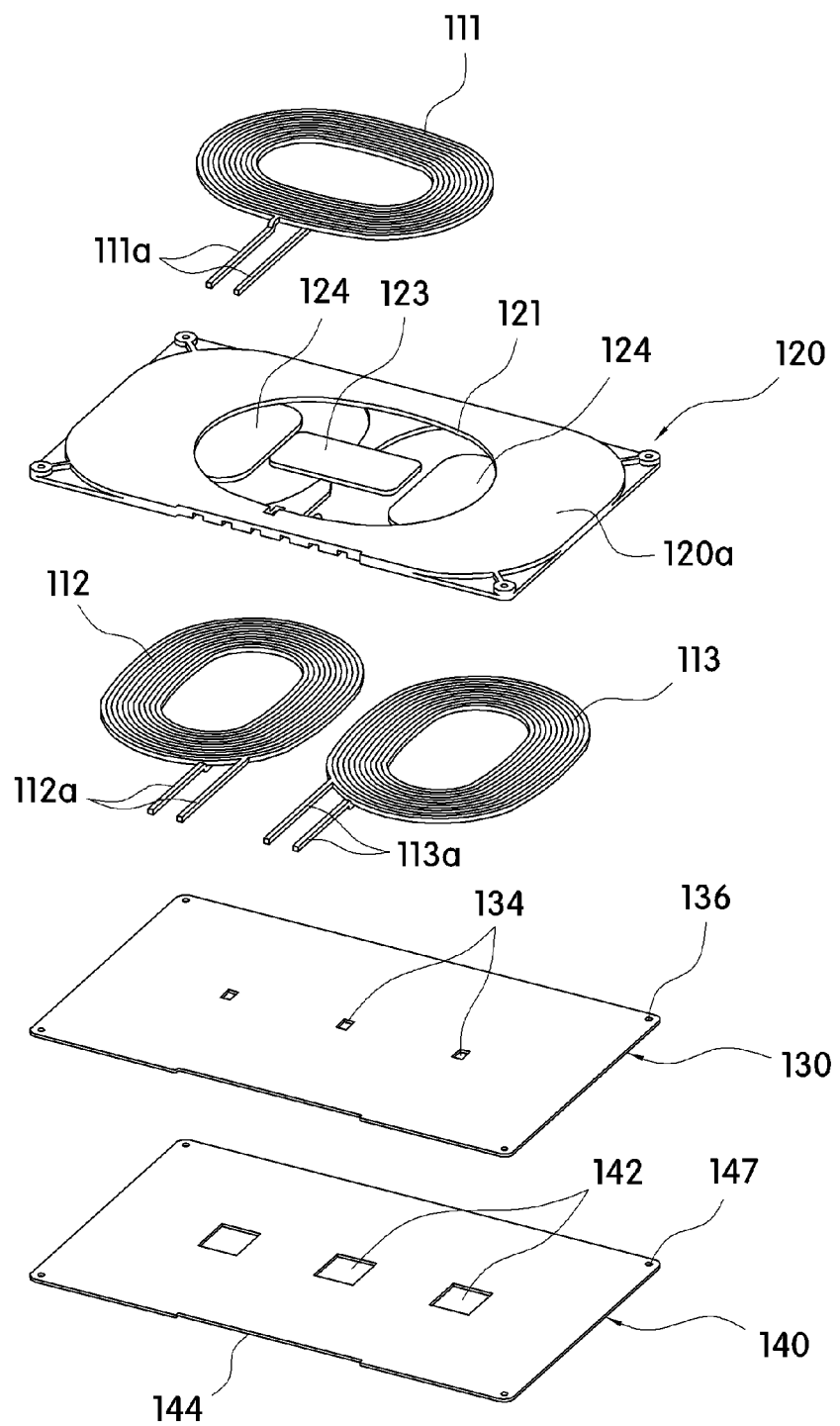
FIG. 3 is an exploded view of FIG. 1.

Hereinafter, exemplary embodiments of the present invention will be described more fully with reference to the accompanying drawings for those skilled in the art to easily implement the present invention. As those skilled in the art would realize, the described embodiments may be modified in various different ways and is not limited to the exemplary embodiments described herein. In the drawings, a part which is not related to the description is omitted to clearly describe the present disclosure. Further, like reference numerals designate like elements throughout the specification.

A wireless power transmission module according to an exemplary embodiment of the present disclosure may be embedded in electronic equipment such as a portable terminal including a smart phone. The wireless power transmission module may transmit wireless power to a wireless power reception module which is electrically connected to a battery to charge the battery included in the electronic equipment.

The wireless power transmission module 100 or 100' may transmit wireless power to an electronic device in which a battery needs to be charged and as schematically illustrated in FIGS. 1 to 3 and 9, include an antenna unit, a magnetic field shielding sheet 130 or 130', and a heat radiating plate 140.

Here, the electronic device may be any one of portable electronic devices such as a portable phone, a PDA, a PMP, a tablet PC, and a multimedia device. Further, the wireless power transmission module 100 may be equipped or provided in a vehicle.

The antenna unit may include at least one antenna. The at least one antenna may include a wireless power transmission antenna to transmit a wireless power signal to the wireless power reception module.

Here, the antenna may be configured by a circular, an oval, or a quadrangular planar coil which may be formed by winding a conductive wire having a predetermined length a plurality of times in a clockwise or counterclockwise direction. Alternatively, the antenna may be formed by patterning a conductor such as a copper foil on a surface of a circuit board (not illustrated) formed of synthetic resin such as polyimide (PI) or PET or be formed to have a loop shaped metal pattern using a conductive ink.

The antenna unit according to the present disclosure may include at least one wireless power transfer antenna 111, 112, and 113 which transmits a wireless power signal to the wireless power reception module to generate power using a magnetic inductive coupling manner or a magnetic resonance manner based on an electric magnetic inductive phenomenon.

For example, the wireless power transfer antennas 111, 112, and 113 may be a Qi standard or PMA standard antenna which operates at 100 to 350 kHz by a magnetic induction method or an A4WP standard antenna which operates at 6.78 MHz by a magnetic resonance method.

Further, the antenna unit according to the present disclosure may be formed based on the combination of at least any two of the Qi standard, the PMA standard, and the A4WP standard or may further include an NFC antenna and a MST antenna which operate at a frequency band which is different from that of the wireless power transfer antenna, in addition to the wireless power transfer antenna.

Each of the wireless power transfer antennas 111, 112, and 113 serves as a transmitting coil which sends wireless power to transmit power required for the electronic device.

Figure 6:
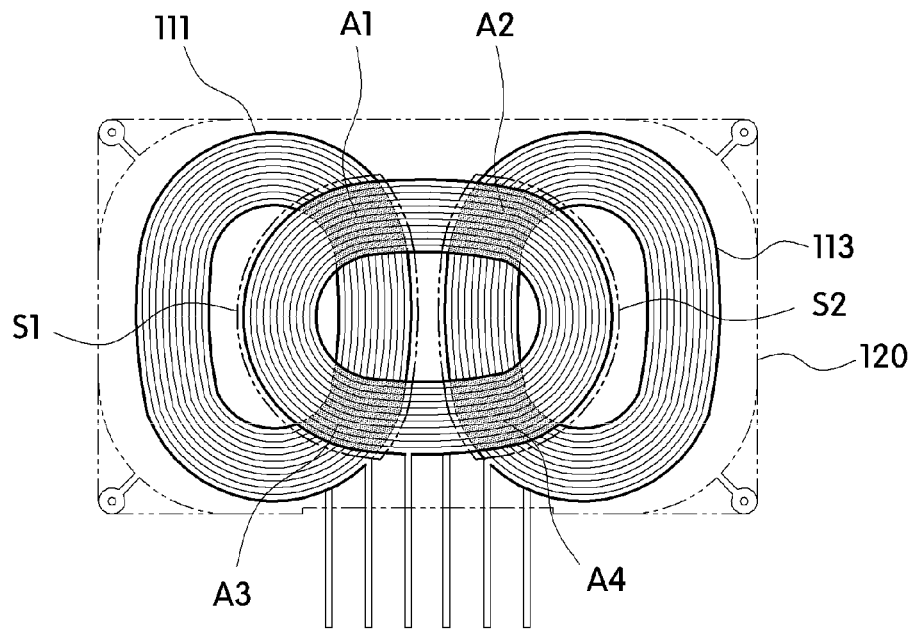
FIG. 6 is a conceptual view for describing an arrangement relationship between coils in a wireless power transmission module according to an exemplary embodiment of the present disclosure.

The wireless power transfer antennas 111, 112, and 113 may be provided as a plurality of antennas and at least a part of the wireless power transfer antennas 111, 112, and 113 may be stacked over the other to overlap each other. For example, the wireless power transfer antennas 111, 112, and 113 may be provided as three planar coils and one planar coil 111 may be disposed above the remaining two planar coils 112 and 113 so as to partially overlaps the remaining planar coils 112 and 113 (see A1, A2, A3, and A4 of FIG. 6).

Hereinafter, for the convenience of description, two planar coils which are disposed on the same plane are referred to as a second coil 112 and a third coil 113 and the planar coil which is stacked above the second coil 112 and the third coil 113 is referred to as a first coil 111.

However, the present invention is not limited to the above-described coupling and arrangement relationship and the vertical arrangement relationship of the first coil 111, the second coil 112, and the third coil 113, and the total number of the planar coils may be changed in various manners.

In this case, when the wireless power transfer antennas 111, 112, and 113 are configured by a plurality of planar coils and at least one is stacked with respect to the other planar coils, the wireless power transmission module 100 according to the present disclosure may include a supporting plate 120 to fix the positions of the plurality of coils 111, 112, and 113.

That is, when the plurality of coils 111, 112, and 113 is multilayered and partially overlaps each other, the supporting plate 120 may allow the plurality of coils 111, 112, and 113 to form the overlapping regions A1, A2, A3, and A4 therebetween in desired positions with desired areas.

Figure 4A:
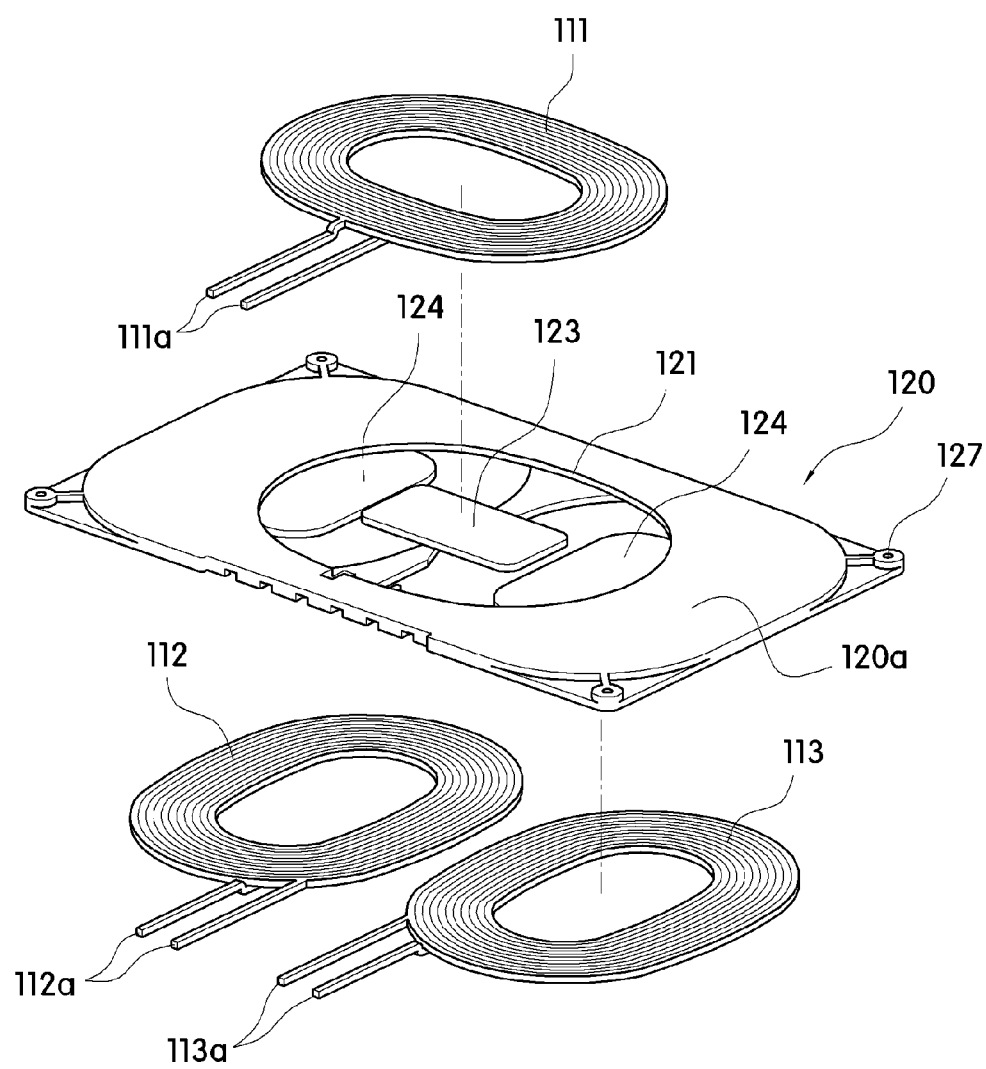
FIG. 4A is a view illustrating a state in which planar coils are separated from a supporting plate.
Figure 4B:
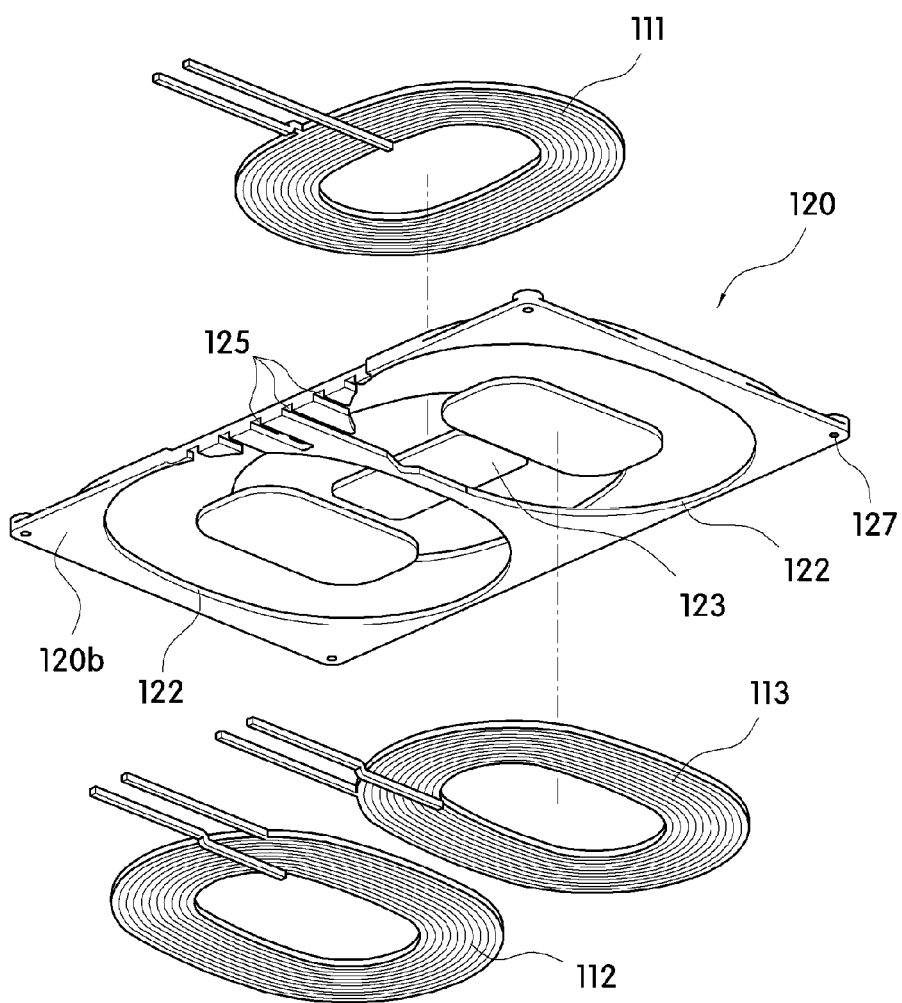
FIG. 4B is a view illustrating a state of FIG. 4A as seen from a bottom side.

To this end, the supporting plate 120 may be formed of a planar member which includes a first surface 120a and a second surface 120b which are opposite to each other and has a predetermined area. Further, a plurality of seating grooves 121 and 122 may be formed to be sunk by a predetermined depth in at least one of the first surface 120a and the second surface 120b (see FIGS. 3, 4A, and 4B).

Here, the plurality of seating grooves 121 and 122 may include a first seating groove 121 for receiving the first coil 111 disposed at an upper portion among the plurality of coils and two second seating grooves 122 for receiving the second coils 112 and the third coils 113 which are disposed on the same plane.

In this case, the first seating groove 121 and the second seating groove 122 may be formed on opposite sides. That is, the first seating groove 121 may be formed on the first surface 120a of the supporting plate 120 and the second seating groove 122 may be formed on the second surface 120b of the supporting plate 120.

Figure 7:
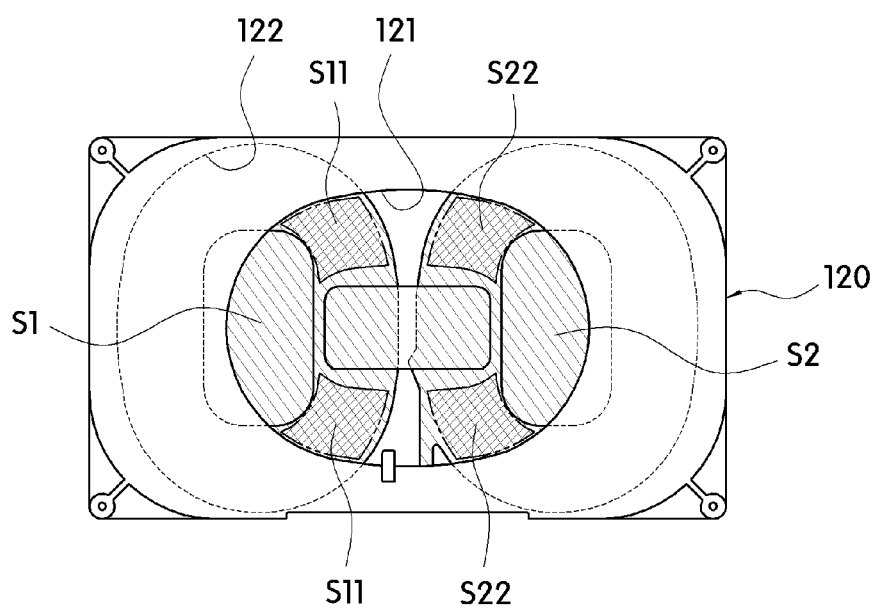
FIG. 7 is a conceptual view for describing overlapping regions between seating grooves in a supporting plate which is applied to a wireless power transmission module according to an exemplary embodiment of the present disclosure.

Further, the first seating groove 121 and the second seating groove 122 may be formed on the first surface 120a and the second surface 120b, respectively, to form overlapping regions S1 and S2 which at least partially overlap each other (see FIG. 7).

Therefore, when the first coil 111 is inserted into the first seating groove 121 and the second coil 112 and the third coil 113 are inserted into the second seating groove 122 by an assembling worker, the first coil 111 may overlap the second coil 112 and the third coil 113 in a position corresponding to partial regions S11 and S12 of the overlapping regions S1 and S2.

In this case, through holes passing through the supporting plate 120 may be formed in partial regions of the overlapping regions S1 and S2 so that a part of the first coil 111 which is disposed in the first seating groove 121 can be in direct contact with a part of the second coil 112 and the third coil 113 disposed in the second seating groove 122.

Therefore, if positions and areas of the overlapping regions are determined in accordance with a required standard in a process of forming the first seating groove 121 and the second seating groove 122, the alignment between the first to third coils may be simply completed without performing an additional alignment work.

Further, protrusions 123 and 124 which protrude from the seating grooves 121 and 122 may be provided at central part of the first seating grooves 121 and the second seating grooves 122, respectively, in positions corresponding to central empty spaces of the coils 111, 112, and 113.

For example, the protrusions may include a first protrusion 123 which protrudes at the central part of the first seating groove 121 from a bottom surface of the first seating groove 121 with a predetermined height and a second protrusion 124 which protrudes at the central part of the second seating groove 122 from a bottom surface of the second seating groove 122 with a predetermined height. Here, the first protrusion 123 and the second protrusion 124 may have a height which is the same as the depth of the seating grooves 121 and 122.

The protrusions 123 and 124 may be located in the central empty spaces of the coils 111, 112, and 113 so as to be in contact with inner sides of the coils 111, 112, and 113 when the coils are inserted. Thus, the inner sides of the coils which are inserted in the seating grooves 121 and 122 may be supported by the protrusions 123 and 124 and outer sides thereof may be supported by inner walls of the seating grooves 121 and 122.

Therefore, even though the wireless power transmission module 100 installed in a vehicle is swayed while the vehicle is being driven, positions of the first coil 111, the second coil 112, and the third coil 113 may be fixed by the seating grooves 121 and 122 so as to suppress undesired movement of the coils 111, 112, and 113.

In this case, the protrusions 123 and 124 may be provided to have areas corresponding to the central empty spaces of the coils. Therefore, some areas of the protrusions 123 and 124 may be disposed in the overlapping regions S1 and S2 where the first seating grooves 121 and the second seating grooves 122 overlap each other and the remaining areas may be disposed in an area where the first seating groove 121 and the second seating groove 122 do not overlap each other.

Accordingly, some areas of the first protrusion 123 formed in the first seating groove 121 which are disposed in the overlapping regions S1 and S2 are in direct contact with parts of the coils 112 and 113 disposed in the second seating groove 122 to support the parts of the coils 112 and 113. Further, some areas of the second protrusion 124 formed in the second seating groove 122 which are disposed in the overlapping regions S1 and S2 are in direct contact with a part of the coil 111 disposed in the first seating groove 121 to support the part of the coil 111.

Further, when a heat radiating function is added to the supporting plate 120, remaining parts of one surface of the coils except the overlapping regions A1, A2, A3, and A4 are in contact with the supporting plate 120, so that the contact area of the coils with the supporting plate 120 may be secured at maximum. Therefore, heat generated in the coils may be quickly dispersed by the supporting plate 120. Herein, the heat radiating function of the supporting plate 120 will be described below.

In the meantime, the first seating groove 121 and the second seating groove 122 may be formed to have the depth which is the same as the thickness of the coils 111, 112, and 113. The thickness of the supporting plate 120 may be same as the sum of thicknesses of a pair of coils 111 and 112 or another pair of coils 111 and 113 which overlap each other. For example, the maximum thickness of the supporting plate 120 may be the same as the sum of the thickness of the first coil 111 and the thickness of the second coil 112.

Therefore, even though the wireless power transmission module 100 according to the present disclosure uses the supporting plate 120 for aligning the positions of the coils, the plurality of coils 111, 112, and 113 may be conveniently aligned without increasing the thickness of the wireless power transmission module.

Further, after the coils 111, 112, and 113 are received in the seating grooves 121 and 122 formed in the supporting plate 120, one surface of the supporting plate 120 including one surface of the coil forms a horizontal plane, so that a contact area between the supporting plate 120 and a magnetic field shielding sheet 130 or 130' may be increased. Therefore, even though the magnetic field shielding sheet 130 or 130' are manufactured as a sheet which is formed of a material having flexibility or strong fragility, one surface of the magnetic field shielding sheet 130 or 130' is supported by the supporting plate 120. Therefore, the magnetic field shielding sheet 130 or 130' can be prevented from being damaged due to an external shock and it is possible to horizontally dispose the magnetic field shielding sheet.

In the meantime, a guide groove 125 for receiving one pair of connection terminals 111a, 112a, and 113a provided in each of the coils 111, 112, and 113 may be formed on at least one surface of the supporting plate 120. The guide groove 125 may be formed to communicate with at least one of the first seating groove 121 and the second seating groove 122 to appropriately dispose the connection terminals of the coils which are received in the corresponding seating grooves. For example, the guide groove 125 may be formed on the second surface 120b of the supporting plate 120.

The guide groove 125 may be provided to have the height which is approximately the same as a wire diameter of a conductive member which configures the planar coils 111, 112, and 113. Therefore, when the magnetic field shielding sheet 130 is disposed on one surface of the supporting plate 120, one surface of the first coil 111 and one surface of the second coil 112 may be completely in contact with one surface of the magnetic field shielding sheet 130.

In the meantime, in addition to a function of easily disposing the coils and fixing the position, the supporting plate 120 may have a heat radiating function to quickly disperse the heat generated by the coils, thereby solving a thermal issue.

Figure 5:
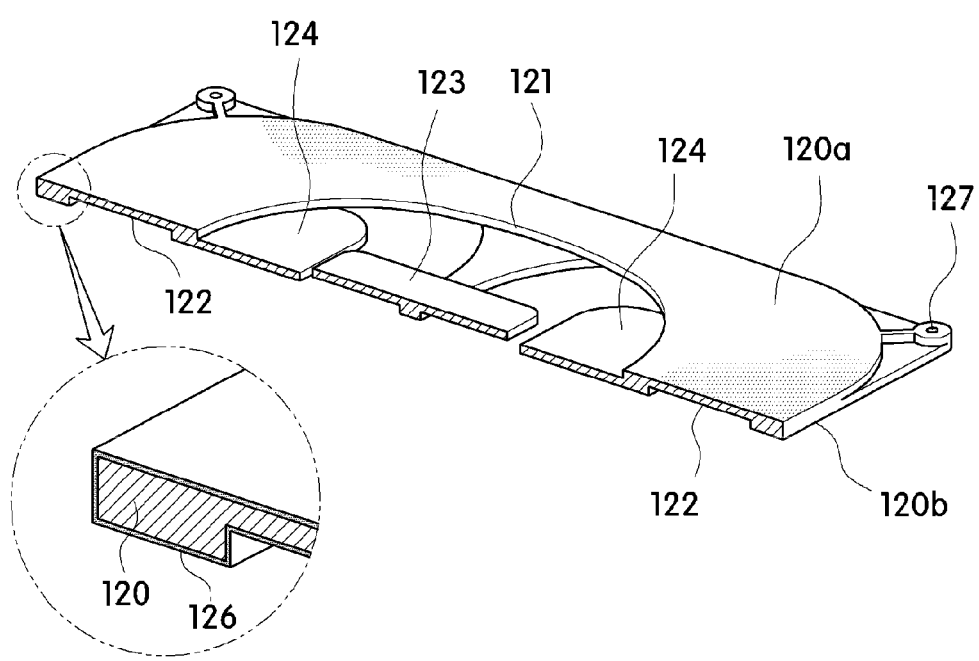
FIG. 5 is a view illustrating a cut state of a supporting plate which is applied to a wireless power transmission module according to an exemplary embodiment of the present disclosure.

To this end, a coating layer 126 having a heat radiating property may be formed on an outer surface of the supporting plate 120 (see FIG. 5). Alternatively, the supporting plate 120 may be formed of a plastic material having a heat radiating property. Further alternatively, the coating layer 126 having a heat radiating property may be formed on an outer surface of the supporting plate 120 which is formed of a plastic material having a heat radiating property.

For example, the coating layer 126 may include a heat-conductive filler such as a carbon based filler. Graphene, carbon nanotube, or borne nitride may be used as the heat conductive filler.

Further, as the plastic having the heat radiating property, composite plastic including planar graphite may be used. However, the material for the coating layer 126 for heat radiation and/or heat radiating plastic is not limited thereto. It should be noted that all known coating material and heat radiating plastic which are used for heat radiation may be used.

In the meantime, the supporting plate 120 may be formed with at least one fastening hole 127 which is a through hole to be served as a coupling hole with any other member. For example, a fastening member such as a bolt member may be coupled to or passes through the fastening hole 127.

Figure 8:
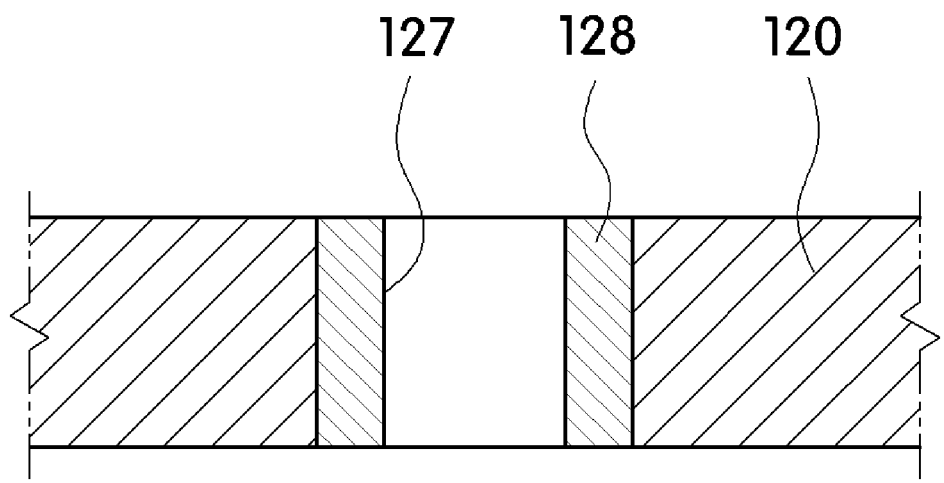
FIG. 8 is a cross-section view taken along B-B of FIG. 1.

In a case that the supporting plate 120 is formed of a plastic material, a metal member 128 may be partially embedded in the fastening hole 127 to suppress the supporting plate 120 from being broken when the supporting plate 120 is coupled to another member by the fastening member (see FIG. 8).

Therefore, the fastening hole 127 is formed in the supporting plate 120 in a position corresponding to the metal member 128 so that clamping force and durability of the supporting plate 120 may be increased. Here, the metal member 128 may be integrated with the supporting plate 120 through insert-molding.

Figure 9:
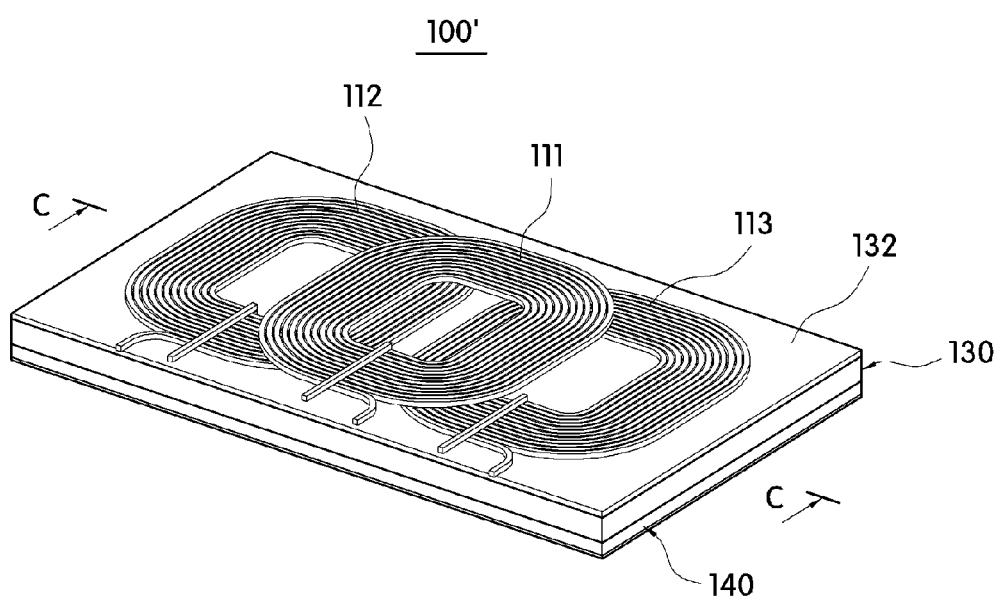
FIG. 9 is a view illustrating another type of a wireless power transmission module in which the supporting plate is removed from FIG. 1.
Figure 10:
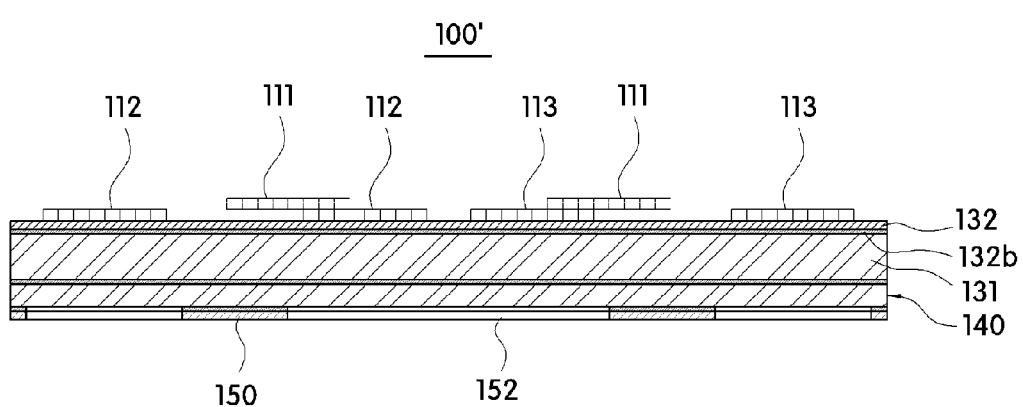
FIG. 10 is a cross-section view taken along C-C of FIG. 9.

In an exemplary embodiment, the above-described supporting plate 120 may not be used for the wireless power transmission module 100' according to the present disclosure (see FIGS. 9 and 10).

The magnetic field shielding sheets 130 or 130' may be disposed on one surface of the planar coils 111, 112, and 113.

The magnetic field shielding sheets 130 or 130' may be formed in a planar type having a predetermined area. The magnetic field shielding sheets 130 or 130' may include magnetic sheets 131 or 131' having magnetism to shield the magnetic fields generated by currents flowing in the planar coils 111, 112, and 113 and induce each of the magnetic fields in a desired direction so as to increase the density of the magnetic flux. Thus, the performance of the antenna which operates at a predetermined frequency band can be increased.

For example, as the magnetic sheets 131 and 131', an amorphous ribbon sheet, a ferrite sheet, or a polymer sheet may be used and a magnetic material whose saturation magnetic flux density B is equal to or higher than 0.25 tesla (T) and magnetic permeability is 30 to 3500 may be used.

In an exemplary embodiment, a separate protective film 132 may be attached onto at least one surface of the magnetic sheet 131 or 131' by means of an adhesive layer 131b.

Here, the amorphous ribbon sheet may be a ribbon sheet including at least one of an amorphous alloy and a nano crystalline alloy. The amorphous alloy may be a Fe based or Co based magnetic alloy, and the ferrite sheet may be a sintered ferrite sheet such as Mn—Zn ferrite or Ni—Zn ferrite. Further, the magnetic sheet 131 may be subject to a flake process to be divided into a plurality of minute pieces so that the entire resistance is increased to suppress generation of eddy current or increase flexibility. The plurality of minute pieces may be formed to be atypical.

Figure 11:
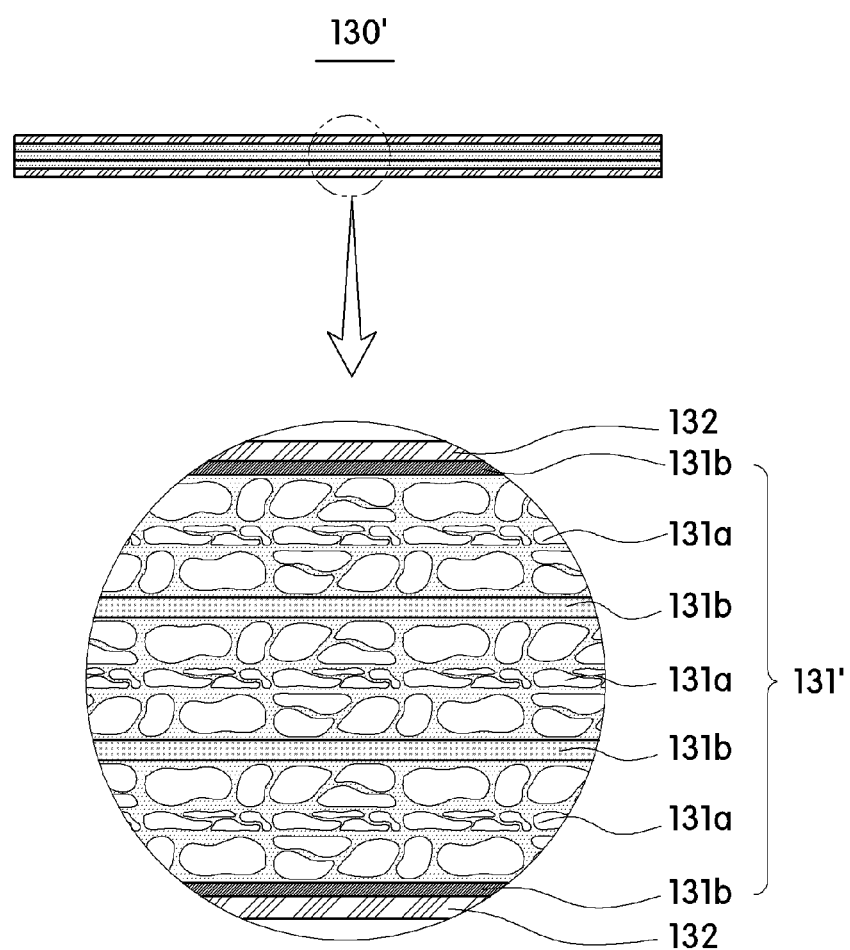
FIG. 11 is a view illustrating a configuration in which magnetic field shielding sheets which are applied to a wireless power transmission module according to an exemplary embodiment of the present disclosure are laminated as a plurality of layers.

In addition, the magnetic field shielding sheet 130' may be a multilayered form which includes a plurality of magnetic sheets 131a laminated by means of the adhesive layer 131b. The plurality of magnetic sheets 131a may be subject to the flake process to be divided into a plurality of minute pieces. The adjacent minute pieces may be entirely or partially insulated from each other (see FIG. 11).

Since the magnetic field shielding sheets 130 and 130' have the known configuration, detailed description thereof will be omitted. It is noted that as the materials for the shielding sheet, all known materials which are generally used may be used.

The heat radiating plate 140 may be disposed on one surface of the magnetic field shielding sheets 130 and 130' to disperse the heat transmitted from a heat source or radiate the heat to the outside.

To this end, the heat radiating plate 140 may be formed of a material having good thermal conductivity. For example, the heat radiating plate 140 may be formed of any one of copper, aluminum, and graphite or a mixture of two or more of them. Further, a material of the heat radiating plate 140 is not limited to the material listed above and may be formed of a material having a thermal conductivity which is equal to or higher than 200 W/m·K.

In an exemplary embodiment, the heat radiating plate 140 may be formed of the planar member having a predetermined area to quickly disperse the heat generated by the heat source by increasing the contact area with the heat source.

The heat radiating plate 140 may be attached onto one surface of the magnetic field shielding sheets 130 and 130' by means of the adhesive layer 131b including a heat conductive component. At least one assembling hole 147 through which the fastening member penetrates may be formed to penetrate the heat radiating plate 140. Here, at least one separate assembling hole 136 may be formed through the magnetic field shielding sheets 130 and 130' in a position corresponding to the at least one assembling hole 147 formed in the heat radiating plate 140.

Therefore, the heat generated by the planar coils 111, 112, and 113 is transmitted to the heat radiating plate 140 through the magnetic field shielding sheets 130 and 130' and then dispersed, so that a temperature of air over the planar coils 111, 112, and 113 can be lowered.

Further, the heat radiating plate 140 may be formed with at least one opening 144 which is disposed toward the center from the edge of the heat radiating plate 140 so that connection terminals 111a, 112a, and 113a drawn from the planar coils 111, 112, and 113 can be connected to a circuit board (not illustrated).

With the opening 144, the connection terminals 111a, 112a, and 113a which protrude toward the opening 144 may be conveniently connected to the circuit board (not illustrated) so that convenience in assembling work may be improved.

In the meantime, at least one through holes 134 and 142 may be formed in corresponding regions to penetrate the magnetic field shielding sheets 130 and 130' and the heat radiating plate 140, respectively. At least one first through hole 134 may be formed to penetrate the magnetic field shielding sheets 130 and 130' and a second through hole 142 may be formed in a position corresponding to the first through hole 134 to penetrate the heat radiating plate 140.

When the circuit board is disposed on a bottom surface of the heat radiating plate 140, the first through hole 134 and the second through hole 142 may serve as a passage through which air around the planar coils 111, 112, and 113 moves to the circuit board.

Here, a temperature sensor (not illustrated) such as a thermistor may be disposed in a region corresponding to the second through hole 142 in the circuit board (not illustrated). When the temperature sensor protrudes from the circuit board with a predetermined height, the second through hole 142 may also serve as a receiving hole to accommodate the temperature sensor simultaneously. In this case, the second through hole 142 may be provided to have a relatively larger area than that of the temperature sensor so that the temperature sensor is not be in contact with the heat radiating plate 140.

With such configuration, heat exchange is generated between air and the heat generated in the planar coils 111, 112, and 113 when the wireless power transmission module operates. The air flows toward the temperature sensor so that the temperature of the heat generated in the planar coils 111, 112, and 113 is detected. Therefore, when it is detected that a temperature of the planar coils 111, 112, and 113 is equal to or higher than a predetermined value, an entire operation may be stopped so that any problem including damage of the electronic parts due to the overheat may be prevented in advance.

In this case, the first through hole 134 may be formed in a region corresponding to a hollow portion of the planar coils 111, 112, and 113. The reason is that the first through hole 134 does not overlap a patterned portion of the planar coils 111, 112, and 113 so that the air around the planar coils 111, 112, and 113 smoothly flows toward the first through hole 134.

In the meantime, the heat radiating plate 140 according to the present disclosure may be formed of a planar metal plate such as copper or aluminum so as to serve as a support member which supports the magnetic field shielding sheets 130 or 130' simultaneously in addition to the heat radiating function of dispersing or releasing heat generated by a heat source such as the planar coils 111, 112, and 113.

That is, even though the magnetic field shielding sheets 130 and 130' are configured as a weak sheet such as a ferrite sheet or a polymer sheet or flexible sheet, the magnetic field shielding sheets 130 and 130' may be supported by the heat radiating plate 140 which is formed of a metal material having a predetermined strength. Thus, when the wireless power transmission modules 100 and 100' according to the present disclosure are assembled with other components such as a case or a housing, an assembling property and a fastening property may be improved.

Figure 12:
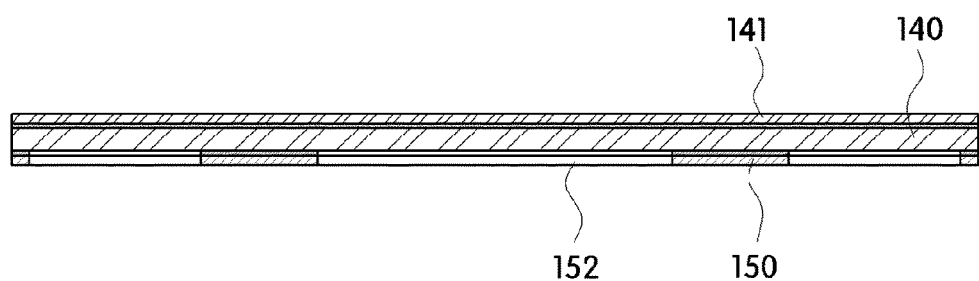
FIG. 12 is a cross-sectional view illustrating a state in which a metallic protective film is attached onto a heat radiating plate which is applied to the present disclosure.

Alternatively, the heat radiating plate 140 according to the present disclosure may be a planar graphite sheet to increase a heat radiating performance. When the heat radiating plate 140 is a planar graphite sheet, a metallic protective film 150 may be attached onto at least one surface of the graphite sheet (see FIGS. 10 and 12).

In this case, the metallic protective film 150 may have a thickness which is relatively smaller than that of the heat radiating plate 140. That is, when the heat radiating plate 140 is formed of a material having a small strength such as graphite, the metallic protective film 150 may be provided to have a thickness which is approximately the same as a thickness of the protective film 150 which is attached on at least one surface of the heat radiating plate 140 in the related art, in order to supplement the small strength.

By doing this, the metallic protective film 150 may perform simultaneously a function of supplementing the heat radiating performance of the heat radiating plate 140 and a function of protecting and concealing the heat radiating plate 140, as a substitute for the protective film of the related art which is used to protect the heat radiating plate 140 from an external environment.

Here, the metal material which configures the metallic protective film 150 may be copper, aluminum or an alloy formed by combination thereof which has a good thermal conductivity, or an alloy including at least one of copper and aluminum. In an exemplary embodiment, the metallic protective film 150 may have a thickness which is one ninth to one third of the thickness of the heat radiating plate 140.

For example, the metallic protective film 150 may be formed of a metal thin film having a thermal conductivity which is equal to or higher than 200 W/m·K. In this case, the metal thin film may be provided to have a small thickness like an aluminum foil or a copper foil.

Therefore, the metallic protective film 150 formed of a metal material may be provided to have a thickness which is equal to or smaller than a thickness of the protective film of the related art and then may replace the protective film of the related art. Therefore, the heat radiating property of the heat radiating member may be enhanced without increasing a total thickness of the heat radiating member.

Further, since the metallic protective film 150 is formed of a metal material, a rigidity of the material may be significantly increased as compared with the protective film of the related art which is formed of a material such as PET. Therefore, the protective film according to the prior art is easily torn due to an external shock or damaged by a scratch, but the heat radiating plate 140 according to the present disclosure may be protected from the external shock by means of the metal material having a high rigidity. Thus, the heat radiating plate 140 may be more stably protected from the external environment.

The metallic protective film 150 may be attached onto one surface of the heat radiating plate 140 by means of the adhesive layer. In this case, a protective film 141 may be provided on the other surface of the heat radiating plate 140 to simply protect the heat radiating plate 140.

When the heat radiating plate 140 is attached onto one surface of the magnetic field shielding sheets 130 and 130', the protective film 141 may be removed from the heat radiating plate 140 (see FIG. 10).

Here, the adhesive layer may include a heat conductive component to further increase a heat radiating effect. The adhesive layer may be provided as an adhesive including a heat conductive component or a form including a planar base member and an adhesive including a heat conductive component which is applied on at least one surface of the base member.

Figure 13:
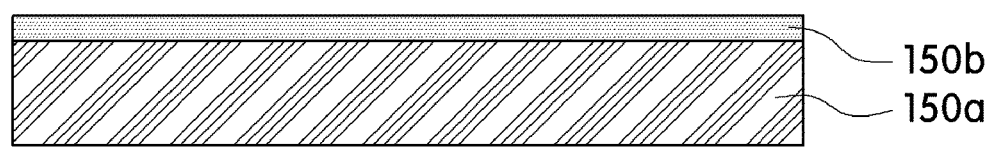
FIG. 13 is a view illustrating a case when a metallic protective film is formed of a base material layer and a coating layer shown in FIG. 12.

In the meantime, the metallic protective film 150' may include a base material layer 150a which is formed of a metal material and a coating layer 150b which is emissively coated on at least one surface of the base material layer 150a in order to increase the heat radiating performance, as illustrated in FIG. 13. Here, as the coating layer 150b, a metal oxide including ceramic or carbon black having a nano size particle size may be used.

The coating layer 150b increases emissivity, thereby increasing heat radiating effect of the metallic protective film 150.

Further, a surface of the metal material which configures the metallic protective film 150 is oxidized through a blackening process so that the surface of the metallic protective film is formed as an oxide film. For example, when the metal material is copper, the oxide film may be CuO and $Cu_2O$.

With the oxide film, the cracking can be minimized by suppressing corrosion, and adhesion and adhesive strength can be improved in accordance with the increased surface area. Further, emissivity of the material is increased so that heat radiating property may be further increased without increasing an entire thickness.

Further, the oxide film formed on the surface of the metal layer serves as an insulating layer to increase entire resistance, thereby reducing the generation of an eddy current during wireless charging and increasing a charging efficiency. Here, the blackening process may be performed using chemicals, or a heat treatment, or a plasma treatment.

In the meantime, as illustrated in FIGS. 14A to 15C, the metallic protective film 150 may be formed with at least one slit 152 having a predetermined length to increase resistance of the metallic protective film 150. Thus, an eddy current may not be generated during the time of wireless charging, which may result in increase of a charging efficiency.

Here, the slit 152 may be formed on the entire area of the metallic protective film 150 or partially formed on a local area of the metallic protective film 150. Further, when a plurality of slits 152 is provided, the plurality of slits 152 may be disposed with a designated pattern or disposed with a random pattern.

In this case, the slit 152 may be formed in a region corresponding to the wireless power transfer antennas 111, 112, and 113 of the antenna unit disposed on one surface of the magnetic field shielding sheets 130 and 130'. The slit 152 may be formed to be perpendicular to a pattern which forms the wireless power transfer antennas 111, 112, and 113.

Figure 14A:
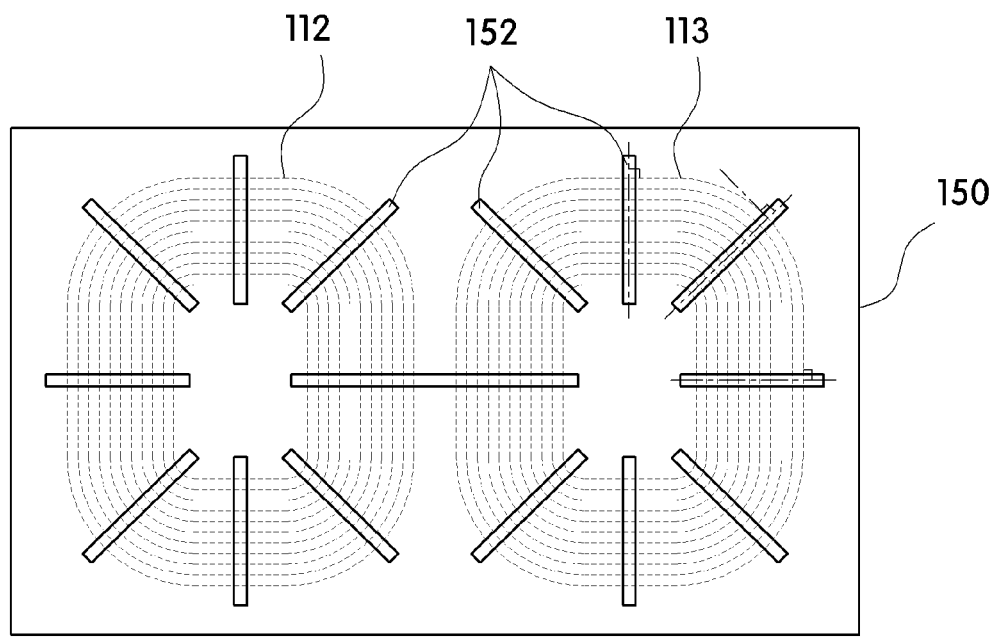
FIGS. 14A and 14B are schematic views illustrating an arrangement relationship between a slit and a wireless power transfer antenna when the slit is formed on a metallic protective film which is applied to the present disclosure.

That is, when the wireless power transfer antennas 111, 112, and 113 are formed to have a rectangular pattern, as illustrated in FIG. 14A, the slit 152 may be provided to have a predetermined length and to be perpendicular to a length direction of a pattern which configures the wireless power transfer antennas 111, 112, and 113.

Figure 14B:
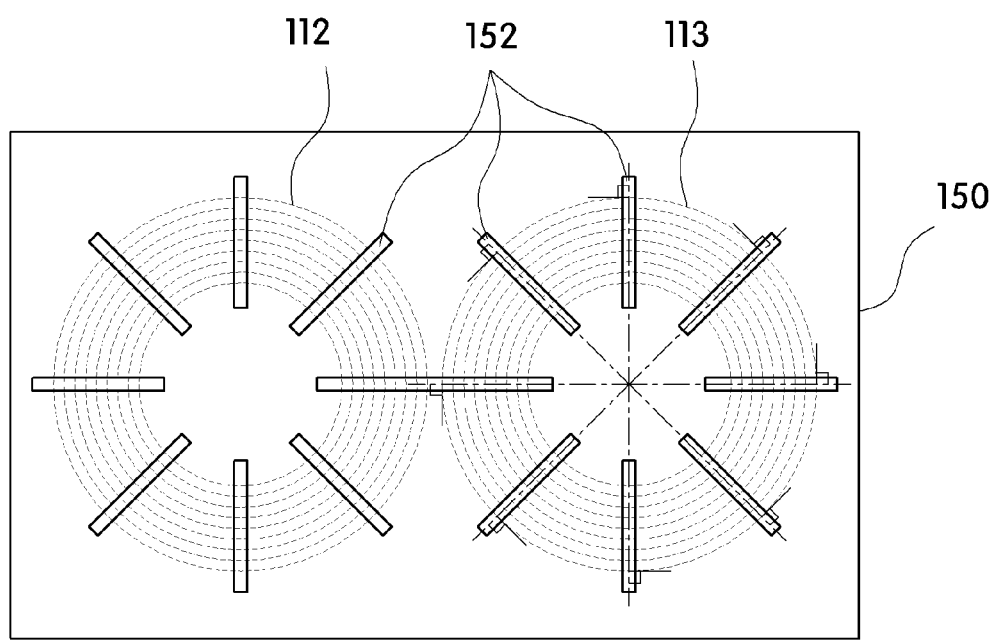
Figure 15A:
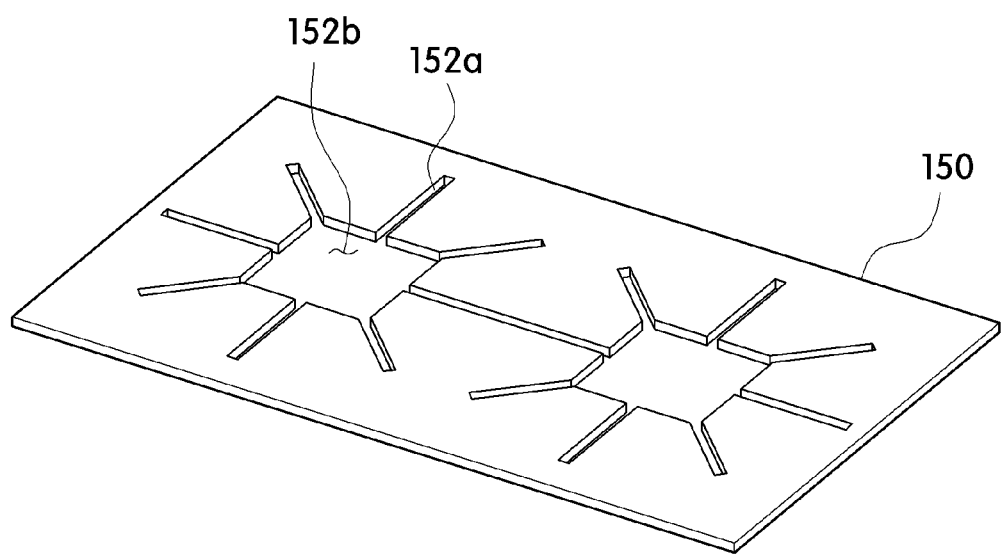
FIGS. 15A to 15C are views illustrating various shapes of slits which may be formed on the metallic protective film shown in FIG. 12.
Figure 15B:
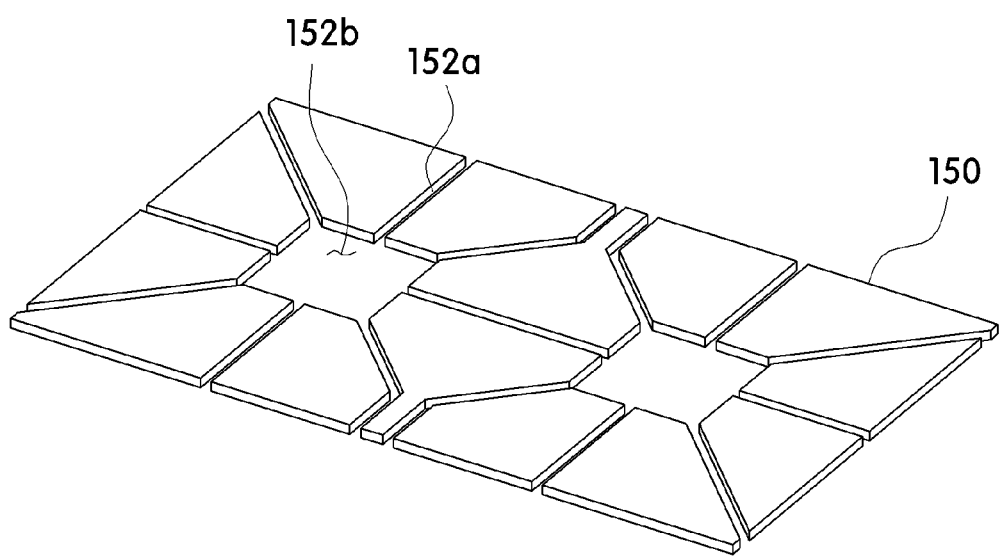
Figure 15C:
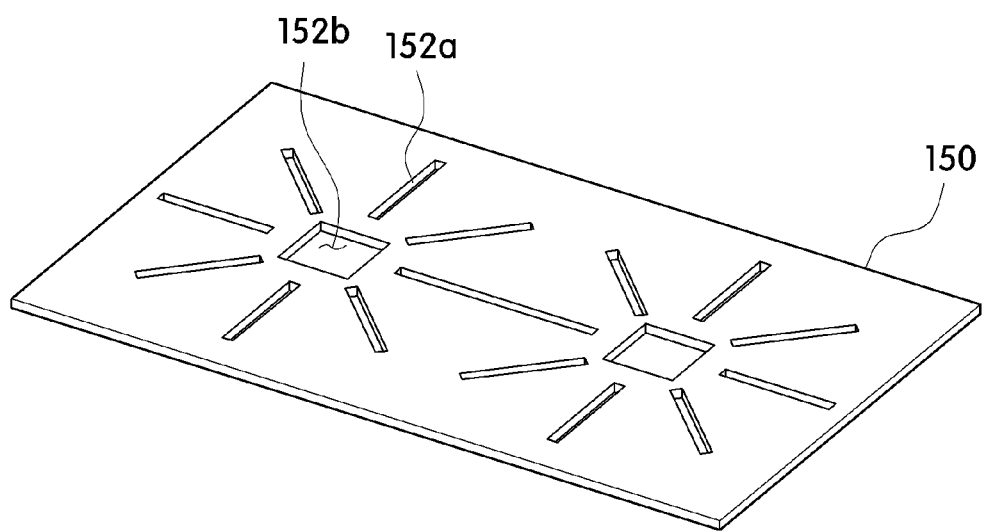

In addition, when the wireless power transfer antennas 111, 112, and 113 are formed to have a circular pattern, as illustrated in FIG. 14B, the slit 152 may be formed to have a predetermined length and to be perpendicular to a tangent line of a pattern which configures the wireless power transfer antennas 111, 112, and 113.

Even though not illustrated, when the wireless power transfer antennas 111, 112, and 113 are formed to include both a straight line section and a curve section, a slit formed in the straight line section may be provided to have a predetermined length and to be perpendicular to a length direction of the pattern which configures the wireless power transfer antennas 111, 112, and 113, as illustrated in FIG. 14A. Further, when the wireless power transfer antennas 111, 112, and 113 are formed to include both a straight line section and a curve section, a slit formed in the curve section may be formed to have a predetermined length and to be perpendicular to a tangent line of the pattern which configures the wireless power transfer antennas 111, 112, and 113, as illustrated in FIG. 14B.

The slit 152 may have various shapes. That is, the slit 152 may be provided as a cutting-out line having a predetermined length (see FIGS. 14A and 14B), or as a through hole which penetrates the inside of the metallic protective film 150, or as a combination of the cutting-out line 152a and the through hole 152b (see FIGS. 15A to 15C).

In the meantime, when the slit 152 is formed on the metallic protective film 150, the slit 152 may not be formed in an immediate upper portion of the heat source except the wireless power transfer antennas 111, 112, and 113. For example, the slit 152 may not be formed in the immediate upper portion of a heat generating element such as an AP or an IC chip so that the heat generated from the heat source may be quickly dispersed.

Although an exemplary embodiment of the present disclosure has been described above, the spirit of the present disclosure is not limited to the exemplary embodiment suggested in this specification. Those skilled in the art may easily suggest another exemplary embodiment by adding, changing, or deleting a component within the scope of the same spirit of the present disclosure. However, it is understood that another exemplary also falls within the spiritual scope of the present invention.

What is claimed is:

1. A wireless power transmission module, comprising:
   an antenna unit including at least one wireless power transfer antenna;
   a magnetic field shielding sheet which shields a magnetic field generated by the antenna unit to suppress external leakage of the magnetic field and concentrate the magnetic field in a desired direction; and
   a planar heat radiating plate which is disposed on one surface of the magnetic field shielding sheet,
   wherein the planar heat radiating plate includes:
   a graphite sheet; and
   a metallic protective film which is attached onto one surface of the graphite sheet to protect and conceal the graphite sheet and serve as an auxiliary heat radiating sheet,
   wherein the metallic protective film is attached onto the graphite sheet by means of an adhesive layer having thermal conductivity,
   wherein the metallic protective film is an aluminum foil or a copper foil, and at least one slit is formed on the aluminum foil or the copper foil,
   wherein the slit is formed in a region corresponding to the wireless power transfer antenna in a direction to be perpendicular to a length direction of an antenna pattern or to a tangent line of the antenna pattern, and
   wherein the metallic protective film includes a base material layer formed of a metal material and a coating layer which is emissively coated onto at least one surface of the base material layer.

2. The wireless power transmission module of claim 1, wherein planar the heat radiating plate includes a planar copper plate or an aluminum plate.

3. The wireless power transmission module of claim 1, wherein the magnetic field shielding sheet is formed with at least one through hole with a predetermined area which penetrates the magnetic field shielding sheet in a region corresponding to a hollow portion of the wireless power transfer antenna to allow air around the antenna unit to move to the heat radiating plate.

4. The wireless power transmission module of claim 1, wherein the magnetic field shielding sheet includes any one of an amorphous ribbon sheet, a ferrite sheet, and a polymer sheet.

5. The wireless power transmission module of claim 1, wherein the magnetic field shielding sheet is formed of a plurality of divided atypical minute pieces.

6. The wireless power transmission module of claim 1, wherein the antenna unit is formed of a plurality of planar coils, and includes a supporting plate in which at least one seating groove is formed on a first surface and a second surface which are opposite to each other, and the plurality of planar coils is disposed in the seating groove.

7. The wireless power transmission module of claim 6, wherein any one of the plurality of planar coils is disposed in a first seating groove formed on the first surface and the remaining planar coils are disposed in a second seating groove formed on the second surface.

8. The wireless power transmission module of claim 7, wherein the first seating groove and the second seating groove are formed to have a depth which is the same size as a thickness of the planar coils.

9. The wireless power transmission module of claim 7, wherein the first seating groove and the second seating groove are formed on the first surface and the second surface, respectively such that the first and second grooves at least partially overlap each other to form an overlapping region.

10. The wireless power transmission module of claim 9, wherein a partial region of the overlapping region is formed so as to penetrate the supporting plate so that a part of the planar coil disposed in the first seating groove is in direct contact with a part of the planar coil disposed in the second seating groove.

11. The wireless power transmission module of claim 10, wherein protrusions are in a position corresponding to a central empty space of the planar coils in a central region of the first seating groove and the second seating groove, respectively.

12. The wireless power transmission module of claim 11, wherein a partial area of a first protrusion formed in the first seating groove is in direct contact with a part of the planar coil disposed in the second seating groove to support a part of the planar coil disposed in the second seating groove and a partial area of a second protrusion formed in the second seating groove is in direct contact with a part of the planar coil disposed in the first seating groove to support a part of the planar coil disposed in the first seating groove.

13. The wireless power transmission module of claim 6, wherein the supporting plate may be formed with at least one fastening hole to be coupled with a fastening member, where the at least one fastening hole penetrates the supporting plate.

14. The wireless power transmission module of claim 13, wherein a metal member having a predetermined area is partially embedded in the supporting plate and the fastening hole is formed in a position corresponding to the metal member.

15. The wireless power transmission module of claim 6, wherein a coating layer having a heat radiating property is formed on an outer surface of the supporting plate.

16. The wireless power transmission module of claim 6, wherein the supporting plate is formed of a plastic material having a heat radiating property.

* * * * *